(12) United States Patent
Berry

(10) Patent No.: US 7,872,343 B1
(45) Date of Patent: *Jan. 18, 2011

(54) DUAL LAMINATE PACKAGE STRUCTURE WITH EMBEDDED ELEMENTS

(75) Inventor: Christopher J. Berry, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/699,739

(22) Filed: Feb. 3, 2010

Related U.S. Application Data

(63) Continuation of application No. 11/835,235, filed on Aug. 7, 2007, now Pat. No. 7,687,899.

(51) Int. Cl.
*H01L 23/22* (2006.01)

(52) U.S. Cl. ...................................... 257/687

(58) Field of Classification Search ........................ None
See application file for complete search history.

(56) References Cited

U.S. PATENT DOCUMENTS

| | | | |
|---|---|---|---|
| 2,596,993 A | 5/1952 | Gookin |
| 3,177,060 A | 4/1965 | Pedersen |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,098,864 A | 7/1978 | Morris et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Scott B Geyer
(74) *Attorney, Agent, or Firm*—Stetina Brunda Garred & Brucker

(57) ABSTRACT

An interconnect structure (i.e., an interposer) which is mounted and electrically connected to a bottom semiconductor package substrate either prior or subsequent to such bottom substrate being populate with one or more electronic components. Subsequently, a top semiconductor package substrate which may also be populated with one or more electronic components is mounted to the interposer, such that all of the electronic components are disposed between the top and bottom interposers. Thereafter, a suitable mold compound is injected between the top and bottom substrates, the mold compound flowing about the electronic components, between the BGA joints, and at least partially about the interposer, thus helping to lock the interposer in place in the completed semiconductor package.

20 Claims, 3 Drawing Sheets

U.S. PATENT DOCUMENTS

| | | |
|---|---|---|
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,129,473 A | 7/1992 | Boyer |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,166,992 A | 11/1992 | Cassidy et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,283,460 A | 2/1994 | Mita |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,745,959 A | 5/1998 | Dodge |
| 6,061,401 A | 5/2000 | Jung |
| 6,092,076 A | 7/2000 | McDonough et al. |
| 6,139,555 A | 10/2000 | Hart et al. |
| 6,140,563 A | 10/2000 | Mousel |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,260,532 B1 | 7/2001 | Mendler |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,333,854 B1 | 12/2001 | Sasaoka et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |

| | | |
|---|---|---|
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,646,339 B1 | 11/2003 | Ku et al. |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,927,478 B2 | 8/2005 | Paek |
| 7,002,805 B2 | 2/2006 | Lee et al. |
| 7,005,327 B2 | 2/2006 | Kung et al. |
| 7,015,571 B2 | 3/2006 | Chang et al. |
| 7,053,469 B2 | 5/2006 | Koh et al. |
| 7,102,209 B1 | 9/2006 | Bayan et al. |
| 7,185,426 B1 | 3/2007 | Hiner et al. |
| 7,297,344 B1 | 11/2007 | Fleischer et al. |
| 7,312,405 B2 | 12/2007 | Hsu |
| 7,687,899 B1 * | 3/2010 | Berry ......................... 257/687 |
| 2001/0014538 A1 | 8/2001 | Kwan et al. |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0089943 A1 | 5/2004 | Kirigaya |
| 2004/0164387 A1 | 8/2004 | Ikenaga et al. |
| 2006/0087020 A1 | 4/2006 | Hirano et al. |
| 2006/0157843 A1 | 7/2006 | Hwang |
| 2006/0231939 A1 | 10/2006 | Kawabata et al. |
| 2007/0108583 A1 | 5/2007 | Shim et al. |
| 2007/0216006 A1 | 9/2007 | Park et al. |
| 2007/0216008 A1 | 9/2007 | Gerber |
| 2007/0289777 A1 | 12/2007 | Pendse |
| 2007/0290319 A1 | 12/2007 | Kim |
| 2008/0006942 A1 | 1/2008 | Park et al. |
| 2008/0017967 A1 | 1/2008 | Bauer et al. |
| 2008/0029858 A1 | 2/2008 | Merilo et al. |
| 2008/0029884 A1 | 2/2008 | Grafe et al. |
| 2008/0283992 A1 | 11/2008 | Palaniappan et al. |

FOREIGN PATENT DOCUMENTS

| | | |
|---|---|---|
| DE | 19734794 A1 | 7/1998 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 A2 | 3/2000 |
| EP | 1032037 | 8/2000 |
| EP | 1032037 A2 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60010756 A | 1/1985 |
| JP | 60116239 | 8/1985 |
| JP | 60195957 | 10/1985 |
| JP | 60231349 | 11/1985 |
| JP | 60231349 A | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63205935 A | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |

| | | |
|---|---|---|
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 09293822 | 11/1997 |
| JP | 10022447 | 1/1998 |
| JP | 10199934 | 7/1998 |
| JP | 10199934 A | 7/1998 |
| JP | 10256240 | 9/1998 |
| JP | 11307675 | 11/1999 |
| JP | 2000150765 | 5/2000 |
| JP | 2000150765 A | 5/2000 |
| JP | 2001060648 | 3/2001 |
| JP | 2002043497 | 2/2002 |
| JP | 2002519848 | 7/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000072714 A | 12/2000 |
| KR | 20000086238 | 12/2000 |
| KR | 20020049944 | 6/2002 |
| WO | 9956316 | 11/1999 |
| WO | 9956316 A1 | 11/1999 |
| WO | 9967821 | 12/1999 |
| WO | 9967821 A1 | 12/1999 |

OTHER PUBLICATIONS

National Semiconductor Corporation, "Leadless Leadframe Package," Informational Pamphlet from webpage, 23 pages, Oct. 2002, www.national.com (see pages 1-23 of attachment NPLdocs).

Vishay, "4 Milliohms in the So-8: Vishay Siliconix Sets New Record for Power MOSFET On-Resistance," Press Release from webpage, 3 pages, www.vishay.com/news/releases, Nov. 7, 2002. (see pages 24-26 of attachment NPLdocs).

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml (see pages 27-31of attachment NPLdocs).

* cited by examiner

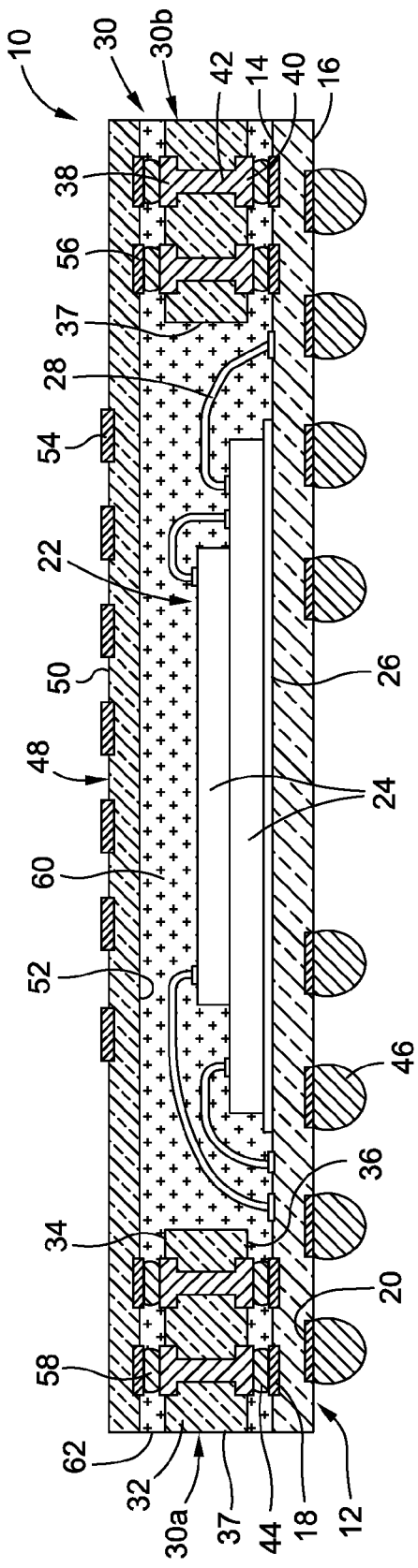
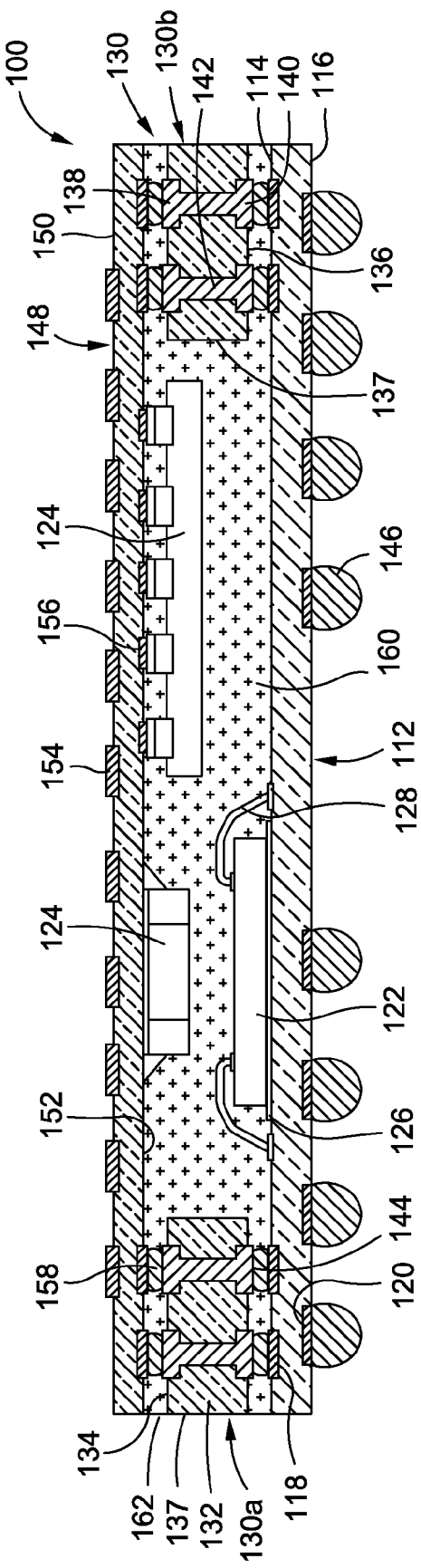
FIG. 1
FIG. 2

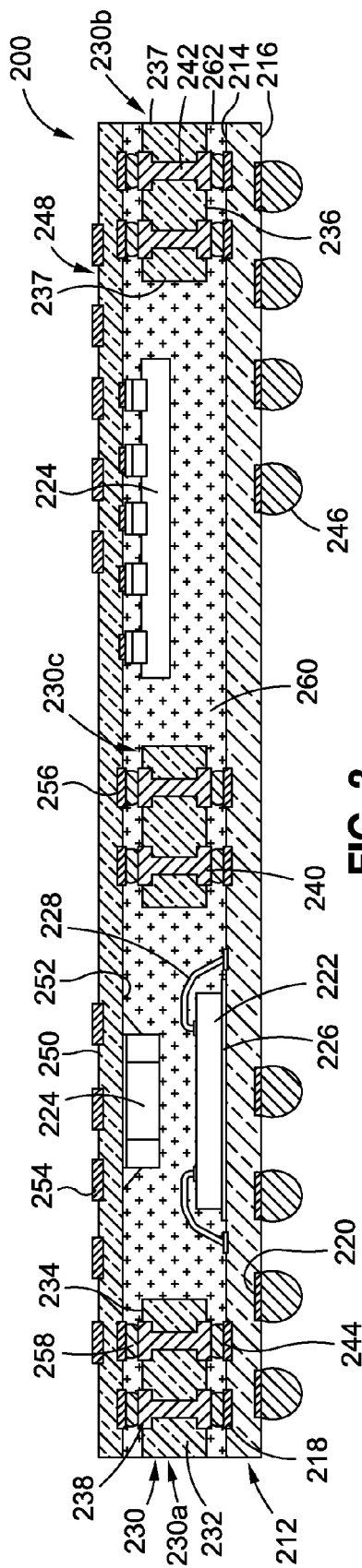
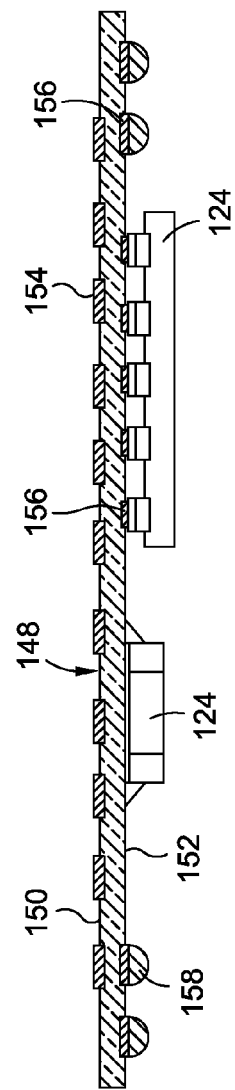
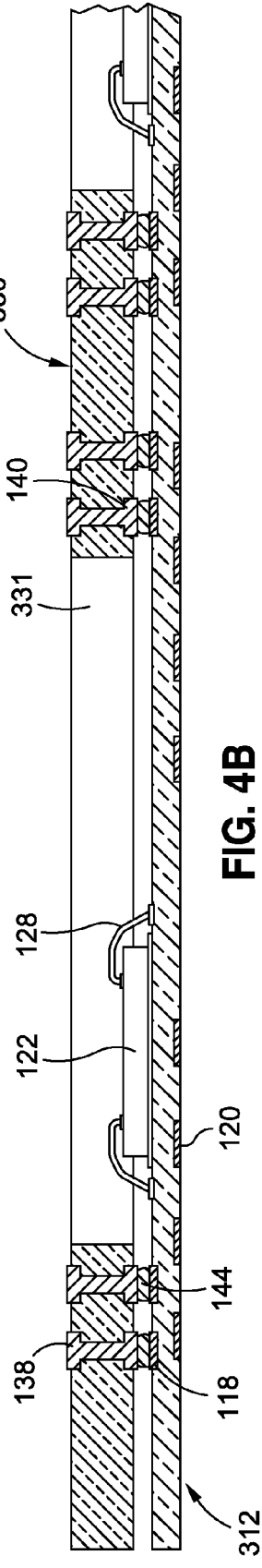
FIG. 3
FIG. 4A
FIG. 4B

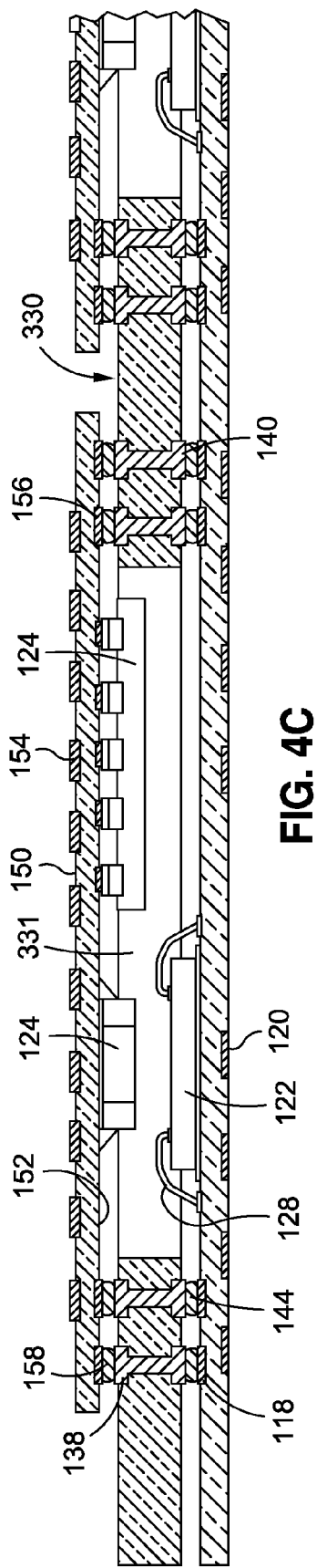
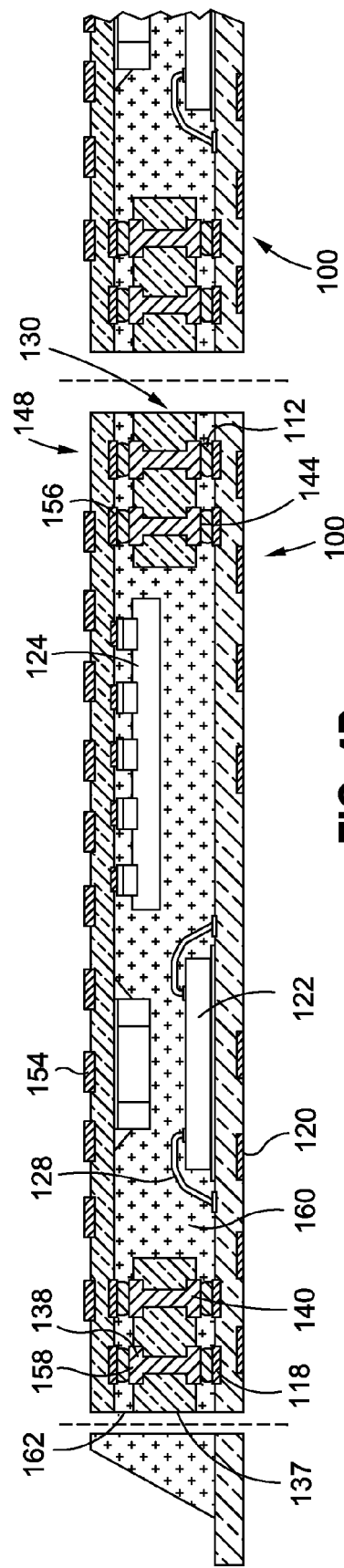
FIG. 4C
FIG. 4D

DUAL LAMINATE PACKAGE STRUCTURE WITH EMBEDDED ELEMENTS

CROSS-REFERENCE TO RELATED APPLICATIONS

The present application is a continuation of U.S. patent application Ser. No. 11/835,235 entitled DUAL LAMINATE PACKAGE STRUCTURE WITH EMBEDDED ELEMENTS filed Aug. 7, 2007 now U.S. Pat. No. 7,687,899.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package which includes a prefabricated embedded interposer configured to allow two complimentary laminate substrate elements (i.e., a bottom element and a top element) to be joined to each other subsequent to one or both of the substrate elements being populated with various electronic components.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor devices or other devices within the package body of the semiconductor package. However, existing solutions for package stacking such as straddle mount laminate BGA or stacked die TSOP often do not meet form factor requirements. Therefore, a new solution is needed. The present invention is an extension of the stacking solution for space efficiency in that it is directed to, among other things, a semiconductor package which includes a prefabricated embedded interposer configured to allow two complimentary laminate substrate elements (i.e., a bottom element and a top element) to be joined to each subsequent to one or both of the substrate elements being populated with various electronic components. In this regard, the present invention provides a two-sided package architecture which allows topside routing (also known as a "lands-over-top" feature) while also enabling the embedding of multiple components, including but not limited to active, passive and prepackaged components. These, as well as other features and attributes of the present invention will be discussed in more detail below.

BRIEF SUMMARY OF THE INVENTION

In accordance with the invention, there is provided an interconnect structure (i.e., an interposer) which is mounted and electrically connected to a bottom semiconductor package substrate either prior or subsequent to such bottom substrate being populated with one or more electronic components. Subsequently, a top semiconductor package substrate which may also be populated with one or more electronic components is mounted to the interposer, such that all of the electronic components are disposed between the top and bottom interposers. The mounting of the interposer to the bottom and top substrates may be accomplished by way of a standard ball grid array (BGA) interconnect or other type of interconnect. Thereafter, a suitable mold compound is injected between the top and bottom substrates, the mold compound flowing about the electronic components, between the BGA joints, and at least partially about the interposer, thus helping to lock the interposer in place in the completed semiconductor package. The interposer may be mounted to a bottom substrate strip with an array of units so that a single interposer strip or frame is attached to adjacent units. During singulation (i.e., the separation of the completed units or semiconductor packages from each other), the interposer is separated so that the interposer is exposed on at least one side of the semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a cross-sectional view of the semiconductor package constructed in accordance with a first embodiment of the present invention;

FIG. 2 is a cross-sectional view of a semiconductor package constructed in accordance with a second embodiment of the present invention;

FIG. 3 is a cross-sectional view of a semiconductor package constructed in accordance with a third embodiment of the present invention; and FIGS. 4A-4D illustrate an exemplary sequence of steps which may be used to fabricate the semiconductor package of the second embodiment shown in FIG. 2.

Common reference numerals are used throughout the drawings and detailed description to indicate like elements.

DETAILED DESCRIPTION OF THE INVENTION

Referring now to the drawings wherein the showings are for purposes of illustrating various embodiments of the present invention only, and not for purposes of limiting the same, FIG. 1 depicts a semiconductor package 10 constructed in accordance with a first embodiment of the present invention. The semiconductor package 10 comprises a laminate bottom substrate 12 which has a generally quadrangular configuration defining four (4) peripheral edge segments. In addition, the bottom substrate 12 defines a generally planar top surface 14 and an opposed, generally planar bottom surface 16. Disposed on the top surface 14 is a plurality of top contacts 18 of the bottom substrate 12. In the bottom substrate 12, the top contacts 18 are segregated into two sets, with the top contacts 18 of each set extending along and in spaced relation to a respective one of an opposed pair of the peripheral edge segments defined by the bottom substrate 12. Formed on the bottom surface 16 of the bottom substrate 12 is a plurality of bottom contacts 20. Though not shown in FIG. 1, the top and bottom contacts 18, 20 are electrically connected to each other in a prescribed pattern or arrangement by conductive vias which extend through the bottom substrate 12.

Attached to a central area of the top surface 14 of the bottom substrate 12 is at least one electronic component of the semiconductor package 10, and more particularly a die stack 22. The die stack 22 comprises a plurality of individual semiconductor dies 24 which are arranged in a stacked configuration. In this regard, the uppermost semiconductor die 24 in the die stack 22 is secured to the semiconductor die 24 below it by a layer of suitable adhesive. Similarly, the attachment of the lowermost semiconductor die 24 in the die stack 22 to the top surface 14 of the bottom substrate 12 is facilitated by an adhesive layer 26. As shown in FIG. 1, two (2) semiconductor dies 24 are depicted as being included in the die stack 22. However, those of ordinary skill in the art will recognize that the die stack 22 may be assembled to include greater than the two semiconductor dies 24 depicted in FIG. 1, or may be substituted with a single semiconductor die 24. In the semiconductor package 10, the pads or terminals of each of the semiconductor dies 24 of the die stack 22 are electrically connected to at least some of the top contacts 18 through the use of conductive wires 28. More particularly, in the semiconductor package 10, it is contemplated that the conductive wires 28 may extend from the semiconductor dies 24 to conductive traces or the like which are disposed on the top surface 14 and in turn electrically connected to the top contacts 18 in a prescribed pattern or arrangement. The conductive wires 28 may be fabricated from aluminum, copper, gold, silver or a functional equivalent. Though not shown in FIG. 1, conductive wires may also be used to electrically connect the semiconductor dies 24 of the die stack 22 to each other. Though also not shown in FIG. 1, it is contemplated that the lowermost semiconductor die 24 in the die stack 22 may be electrically connected to such conductive traces on the top surface 14 of the underlying bottom substrate 12 through the use of a flip-chip connection as an alternative to the use of the wires 28.

The semiconductor package 10 further comprises an interposer 30 which is mounted and electrically connected to the top contacts 18 of the bottom substrate 12. It is contemplated that the interposer 30 may comprise a first segment 30a which is electrically connected to each of the top contacts 18 of one of the sets thereof, and a separate second segment 30b which is electrically connected to each of the top contacts 18 of the remaining set thereof. The first and second segments 30a, 30b of the interposer 30 are identically configured to each other and, in the completed semiconductor package 10, extend in spaced, generally parallel relation to each other.

Each of the interposer segments 30a, 30b of the interposer 30 comprises an interposer body 32 having a top surface 34, a bottom surface 36, an opposed pair of longitudinal side surfaces 37, and an opposed pair of lateral side surfaces. Disposed on the top surface 34 of the interposer body 32 of each of the first and second segments 30a, 30b is a plurality of top pads 38. Similarly, disposed on the bottom surface 36 of each of the first and second segments 30a, 30b is a plurality of bottom pads 40. The top and bottom pads 38, 40 disposed on the interposer body 32 of each of the first and second segments 30a, 30b are segregated into multiple pairs, with the top pad 38 of each pair being disposed in spaced, substantial vertical alignment with the bottom pad 40 of the same pair. The top and bottom pads 38, 40 of each pair within each of the first and second segments 30a, 30b are electrically connected to each other by one or more conductive vias 42 which extend through the interposer body 32 substantially perpendicularly between the top and bottom pads 38, 40 of the corresponding pair. The top and bottom pads 38, 40 of each pair are preferably identically configured to each other, and fabricated from a suitable conductive material, as is the conductive via(s) 42 extending therebetween. Those of ordinary skill in the art will recognize that the top and bottom pads 38, 40 of each pair need not necessarily be in exact vertical alignment, and that some degree of juxtaposition therebetween is contemplated to fall within the scope of the present invention.

In the semiconductor package 10, each bottom pad 40 in each of the first and second segments 30a, 30b is electrically connected to a respective one of the top contacts 18 of a corresponding set thereof by a solder ball 44. However, those of ordinary skill in the art will recognize that solder paste, conductive adhesive, or other suitable materials may be employed as an alternative to the use of the solder balls 44. As seen in FIG. 1, such attachment is preferably facilitated such that one of the longitudinal side surfaces 37 of each of the first and second segments 30a, 30b extends in generally co-planar relation to a respective one of the sides or peripheral edge segments defined by the bottom substrate 12. Formed on each of the bottom contacts 20 of the bottom substrate 12 is a solder bump or solder ball 46.

The semiconductor package 10 of the first embodiment further comprises a laminate top substrate 48 which is mechanically and electrically connected to the interposer 30 in a manner which will be described in more detail below. The top substrate 48 also has a generally quadrangular configuration defining four (4) peripheral edge segments. In addition, the top substrate 48 defines a generally planar top surface 50 and an opposed, generally planar bottom surface 52. Disposed in the approximate center of the top surface 50 of the top substrate 48 is a plurality of top contacts 54 of the top substrate 48. Additionally, formed on the bottom surface 52 of the top substrate 48 is a plurality of bottom contacts 56 thereof. In the top substrate 48, the bottom contacts 56 are segregated into two sets, with the bottom contacts 56 of each set extending along and in spaced relation to a respective one of an opposed pair of the peripheral edge segments defined by the top substrate 48. Though not shown, the top and bottom contacts 54, 56 are electrically connected to each other by conductive vias which extend through the top substrate 48. Those of ordinary skill in the art will recognize that each top contact 54 may be electrically connected to one or more bottom contacts 56 in any pattern or arrangement through the use of such conductive vias. The top and bottom contacts 54, 56 are also each preferably identically configured to each other, and fabricated from a suitable conductive material, as is any conductive via extending there between.

In the semiconductor package 10, each top pad 38 of each of the first and second segments 30a, 30b of the interposer 30 is electrically connected to a respective one of the bottom contacts 56 of a corresponding set thereof by a solder ball 58. However, those of ordinary skill in the art will recognize that solder paste, conductive adhesive, or other suitable materials may be employed as an alternative to the use of the solder balls 58. As is also seen in FIG. 1, such attachment is preferably facilitated such that one of the longitudinal side surfaces 37 of each of the first and second segments 30a, 30b extends in generally co-planar relation to a respective one of the sides or peripheral edge segments defined by the top substrate 48. Thus, in addition to extending in generally co-planar relation to respective longitudinal side surfaces 37 of the first and second segments 30a, 30b, the peripheral edge segments defined by the top substrate 48 also extend in generally co-planar relation to respective ones of the peripheral edge segments defined by the bottom substrate 12. When the top substrate 48 is electrically and mechanically connected to the interposer 30 in the above-described manner, the die stack 22 as well as the conductive wires 28 are effectively positioned between the bottom and top substrates 12, 48, and more particularly the top surface 14 of the bottom substrate 12 and the bottom surface 52 of the top substrate 48.

In the semiconductor package 10, the die stack 22, wires 28 and portions of the first and second segments 30a, 30b of the interposer 30 are encapsulated or covered by an encapsulant material which is injected between the bottom and top substrates 12, 48. Such encapsulant material, upon hardening, forms a package body 60 of the semiconductor package 10. Also fully covered by the package body 60 are the solder balls 44, 58 used to effectuate the electrical connection between the first and second segments 30a, 30b of the interposer 30 and the bottom and top substrates 12, 48. The fully formed package body 60 directly contacts the top surface 14 of the bottom substrate 12 as well as the bottom surface 52 of the top substrate 48, and extends to a substantially flush relationship to the peripheral edge segments thereof. In addition, the package body 60 defines multiple side surfaces 62, and is formed such that one of the longitudinal side surfaces 37 of the interposer body 32 of each of the first and second segments 30a, 30b is exposed in and substantially flush with a respective one of such side surfaces 62. Further, though not shown, it is contemplated that each of the lateral side surfaces of the interposer body 32 of each of the first and second segments 30a, 30b will be exposed in and substantially flush with a respective one of the side surfaces 62.

As indicated above, in the semiconductor package 10, two sets of the top contacts 18 are provided on the bottom substrate 12, with the top contacts 18 of each set extending along a respective one of an opposed pair of side surfaces 62 defined by the package body 60. Similarly, two sets of the bottom contacts 56 are provided on the top substrate 48, with the bottom contacts 56 of each set extending along a respective one of an opposed pair of side surfaces 62 defined by the package body 60. However, it is contemplated that the top contacts 18 and bottom contacts 56 may each be segregated into greater or fewer than two sets, and may be arranged so as to extend along one or more of the side surfaces 62 defined by the package body 60 in any combination. As will be recognized, if the top contacts 18 and bottom contacts 56 are each arranged as a single set extending along only a single, common side surface 62 of the package body 60, such semiconductor package may include an interposer 30 having only one of the above-described first and second segments 30a, 30b. Alternatively, if multiple sets of the top contacts 18 and bottom contacts 56 are provided so as to extend along respective ones of each of the side surfaces 62 of the package body 60, the interposer 30 may be formed to have a continuous ring-like or frame-like configuration. The top contacts 54 of the top substrate 48 provide top side routing also known as a "lands-over-top" feature in the completed semiconductor package 10.

Referring now to FIG. 2, there is depicted a semiconductor package 100 constructed in accordance with a second embodiment of the present invention. The semiconductor package 100 comprises a laminate bottom substrate 112 which has a generally quadrangular configuration defining four (4) peripheral edge segments. In addition, the bottom substrate 112 defines a generally planar top surface 114 and an opposed, generally planar bottom surface 116. Disposed on the top surface 114 is a plurality of top contacts 118 of the bottom substrate 112. In the bottom substrate 112, the top contacts 118 are segregated into two sets, with the top contacts 118 of each set extending along and in spaced relation to a respective one of an opposed pair of the peripheral edge segments defined by the bottom substrate 112. Formed on the bottom surface 116 of the bottom substrate 112 is a plurality of bottom contacts 120. Though not shown in FIG. 2, the top and bottom contacts 118, 120 are electrically connected to each other in a prescribed pattern or arrangement by conductive vias which extend through the bottom substrate 112. Further, the top and bottom contacts 118, 120 are preferably identically configured to each other, and fabricated from a suitable conductive material, as is any conductive via extending therebetween.

Attached to a central area of the top surface 114 of the bottom substrate 112 is at least one electronic component 122 of the semiconductor package 100, which is preferably a semiconductor die. The attachment of the electronic component 122 to the top surface 114 of the bottom substrate 112 is facilitated by an adhesive layer 126. Those of ordinary skill in the art will recognize that the electronic component 122 may alternatively comprise the die stack 22 described above in relation to the semiconductor package 10. In the semiconductor package 100, the pads or terminals of the electronic component 122 are electrically connected to at least some of the top contacts 118 through the use of conductive wires 128. More particularly, in the semiconductor package 100, it is contemplated that the conductive wires 128 may extend from the electronic component 122 to conductive traces or the like which are disposed on the top surface 114 and in turn electrically connected to the top contacts 118 in a prescribed pattern or arrangement. The conductive wires 128 may be fabricated from aluminum, copper, gold, silver or a functional equivalent. Though not shown in FIG. 2, it is contemplated that the electronic component 122 may be electrically connected to such conductive traces on the top surface 114 of the underlying bottom substrate 112 through the use of a flip-chip connection as an alternative to the use of the wires 128.

The semiconductor package 100 further comprises an interposer 130 which is mounted and electrically connected to the top contacts 118 of the bottom substrate 112. It is contemplated that the interposer 130 may comprise a first segment 130a which is electrically connected to each of the top contacts 118 of one of the sets thereof, and a separate second segment 130b which is electrically connected to each of the top contacts 118 of the remaining set thereof. The first and second segments 130a, 130b of the interposer 130 are identically configured to each other and, in the completed semiconductor package 100, extend in spaced, generally parallel relation to each other.

Each of the interposer segments 130a, 130b of the interposer 130 comprises an interposer body 132 having a top surface 134, a bottom surface 136, an opposed pair of longitudinal side surfaces 137, and an opposed pair of lateral side surfaces. Disposed on the top surface 134 of the interposer body 132 of each of the first and second segments 130a, 130b is a plurality of top pads 138. Similarly, disposed on the bottom surface 136 of each of the first and second segments 130a, 130b is a plurality of bottom pads 140. The top and bottom pads 138, 140 disposed on the interposer body 132 of each of the first and second segments 130a, 130b are segregated into multiple pairs, with the top pad 138 of each pair being disposed in spaced, substantial vertical alignment with the bottom pad 140 of the same pair. The top and bottom pads 138, 140 of each pair within each of the first and second segments 130a, 130b are electrically connected to each other by one or more conductive vias 142 which extend through the interposer body 132 substantially perpendicularly between the top and bottom pads 138, 140 of the corresponding pair. The top and bottom pads 138, 140 of each pair are preferably identically configured to each other, and fabricated from a suitable conductive material, as is the conductive via(s) 142 extending therebetween. Those of ordinary skill in the art will recognize that the top and bottom pads 138, 140 of each pair need not necessarily be in exact vertical alignment, and that some degree of juxtaposition therebetween is contemplated to fall within the scope of the present invention.

In the semiconductor package 100, each bottom pad 140 in each of the first and second segments 130a, 130b is electrically connected to a respective one of the top contacts 118 of a corresponding set thereof by a solder ball 144. However, those of ordinary skill in the art will recognize that solder paste, conductive adhesive, or other suitable materials may be employed as an alternative to the use of the solder balls 144. As seen in FIG. 2, such attachment is preferably facilitated such that one of the longitudinal side surfaces 137 of each of the first and second segments 130a, 130b extends in generally co-planar relation to a respective one of the sides or peripheral edge segments defined by the bottom substrate 112. Formed on each of the bottom contacts 120 of the bottom substrate 112 is a solder bump or solder ball 146.

The semiconductor package 100 of the first embodiment further comprises a laminate top substrate 148 which is mechanically and electrically connected to the interposer 130 in a manner which will be described in more detail below. The top substrate 148 also has a generally quadrangular configuration defining four (4) peripheral edge segments. In addition, the top substrate 148 defines a generally planar top surface 150 and an opposed, generally planar bottom surface 152. Disposed in the approximate center of the top surface 150 of the top substrate 148 is a plurality of top contacts 154 of the top substrate 148. Additionally, formed on the bottom surface 152 of the top substrate 148 is a plurality of bottom contacts 156 thereof. In the top substrate 148, some of the bottom contacts 156 are segregated into two sets, with the bottom contacts 156 of each such set extending along and in spaced relation to a respective one of an opposed pair of the peripheral edge segments defined by the top substrate 148. Though not shown, the top and bottom contacts 154, 156 are electrically connected to each other by conductive vias which extend through the top substrate 148. Those of ordinary skill in the art will recognize that each top contact 154 may be electrically connected to one or more bottom contacts 156 in any pattern or arrangement through the use of such conductive vias. The top and bottom contacts 154, 156 are also each preferably identically configured to each other, and fabricated from a suitable conductive material, as is any conductive via extending there between.

Attached to a central area of the bottom surface 152 of the top substrate 148 is at least one, and preferably multiple electronic components 124. Such electronic component(s) 124 may comprise semiconductor dies, passive devices or the like provided in any combination. The attachment of one or more of the electronic components 124 to the bottom surface 152 of the top substrate 148 may be facilitated by an adhesive layer. In the semiconductor package 100, the pads or terminals of the electronic components 124 are electrically connected to respective ones of the centrally located bottom contacts 156 through the use of a flip-chip connection. Though not shown in FIG. 2, it is contemplated that the electronic components 124 may be electrically connected to such bottom contacts 156 through the use of conductive wires as an alternative to the use of a flip-chip connection.

In the semiconductor package 100, each top pad 138 of each of the first and second segments 130a, 130b of the interposer 130 is electrically connected to a respective one of the bottom contacts 156 of a corresponding set thereof by a solder ball 158. However, those of ordinary skill in the art will recognize that solder paste, conductive adhesive, or other suitable materials may be employed as an alternative to the use of the solder balls 158. As is also seen in FIG. 2, such attachment is preferably facilitated such that one of the longitudinal side surfaces 137 of each of the first and second segments 130a, 130b extends in generally co-planar relation to a respective one of the sides or peripheral edge segments defined by the top substrate 148. Thus, in addition to extending in generally co-planar relation to respective longitudinal side surfaces 137 of the first and second segments 130a, 130b, the peripheral edge segments defined by the top substrate 148 also extend in generally co-planar relation to respective ones of the peripheral edge segments defined by the bottom substrate 112. When the top substrate 148 is electrically and mechanically connected to the interposer 130 in the above-described manner, the electronic components 122, 124 as well as the conductive wires 128 are effectively positioned between the bottom and top substrates 112, 148, and more particularly the top surface 114 of the bottom substrate 112 and the bottom surface 152 of the top substrate 148.

In the semiconductor package 100, the electronic components 122, 124, wires 128 and portions of the first and second segments 130a, 130b of the interposer 130 are encapsulated or covered by an encapsulant material which is injected between the bottom and top substrates 112, 148. Such encapsulant material, upon hardening, forms a package body 160 of the semiconductor package 100. Also fully covered by the package body 160 are the solder balls 144, 158 used to effectuate the electrical connection between the first and second segments 130a, 130b of the interposer 130 and the bottom and top substrates 112, 148. The fully formed package body 160 directly contacts the top surface 114 of the bottom substrate 112 as well as the bottom surface 152 of the top substrate 148, and extends to a substantially flush relationship to the peripheral edge segments thereof. In addition, the package body 160 defines multiple side surfaces 162, and is formed such that one of the longitudinal side surfaces 137 of the interposer body 132 of each of the first and second segments 130a, 130b is exposed in and substantially flush with a respective one of such side surfaces 162. Further, though not shown, it is contemplated that each of the lateral side surfaces of the interposer body 132 of each of the first and second segments 130a, 130b will be exposed in and substantially flush with a respective one of the side surfaces 162.

As indicated above, in the semiconductor package 100, two sets of the top contacts 118 are provided on the bottom substrate 112, with the top contacts 118 of each set extending along a respective one of an opposed pair of side surfaces 162 defined by the package body 160. Similarly, two sets of the bottom contacts 156 are provided on the top substrate 148, with the bottom contacts 156 of each set extending along a respective one of an opposed pair of side surfaces 162 defined by the package body 160. However, it is contemplated that the top contacts 118 and bottom contacts 156 (other than those to which the electronic components 124 are connected) may each be segregated into greater or fewer than two sets, and may be arranged so as to extend along one or more of the side surfaces 162 defined by the package body 160 in any combination. As will be recognized, if such top contacts 118 and bottom contacts 156 are each arranged as a single set extending along only a single, common side surface 162 of the package body 160, such semiconductor package may include an interposer 130 having only one of the above-described first and second segments 130a, 130b. Alternatively, if multiple sets of such top contacts 118 and bottom contacts 156 are provided so as to extend along respective ones of each of the side surfaces 162 of the package body 160, the interposer 130 may be formed to have a continuous ring-like or frame-like configuration. The top contacts 154 of the top substrate 148 provide top side routing also known as a "lands-over-top" feature in the completed semiconductor package 100.

Referring now to FIG. 3, there is depicted a semiconductor package 200 constructed in accordance with a third embodiment of the present invention. The semiconductor package 200 comprises a laminate bottom substrate 212 which has a generally quadrangular configuration defining four (4) peripheral edge segments. In addition, the bottom substrate 212 defines a generally planar top surface 214 and an opposed, generally planar bottom surface 216. Disposed on the top surface 214 is a plurality of top contacts 218 of the bottom substrate 212. In the bottom substrate 212, the top contacts 218 are segregated into at least three sets, with the top contacts 218 of two of these sets extending along and in spaced relation to a respective one of an opposed pair of the peripheral edge segments defined by the bottom substrate 212. The top contacts 218 of the third set extend between and in generally parallel relation to the top contacts 218 of the other two sets thereof. Formed on the bottom surface 216 of the bottom substrate 212 is a plurality of bottom contacts 220. Though not shown in FIG. 3, the top and bottom contacts 218, 220 are electrically connected to each other in a prescribed pattern or arrangement by conductive vias which extend through the bottom substrate 212.

Attached to a central area of the top surface 214 of the bottom substrate 212 is at least one electronic component 222 of the semiconductor package 200, which is preferably a semiconductor die. The attachment of the electronic component 222 to the top surface 214 of the bottom substrate 212 is facilitated by an adhesive layer 226. Those of ordinary skill in the art will recognize that the electronic component 222 may alternatively comprise the die stack 22 described above in relation to the semiconductor package 10. In the semiconductor package 200, the pads or terminals of the electronic component 222 are electrically connected to at least some of the top contacts 218 through the use of conductive wires 228. More particularly, in the semiconductor package 200, it is contemplated that the conductive wires 228 may extend from the electronic component 222 to conductive traces or the like which are disposed on the top surface 214 and in turn electrically connected to the top contacts 218 in a prescribed pattern or arrangement. The conductive wires 228 may be fabricated from aluminum, copper, gold, silver or a functional equivalent. Though not shown in FIG. 3, it is contemplated that the electronic component 222 may be electrically connected to such conductive traces on the top surface 214 of the underlying bottom substrate 212 through the use of a flip-chip connection as an alternative to the use of the wires 228.

The semiconductor package 200 further comprises an interposer 230 which is mounted and electrically connected to the top contacts 218 of the bottom substrate 212. It is contemplated that the interposer 230 may comprise separate first, second and third segments 230a, 230b, 230c which are electrically connected to each of the top contacts 218 of respective ones of the three sets thereof. The first, second and third segments 230a, 230b, 230c of the interposer 230 are identically configured to each other and, in the completed semiconductor package 200, extend in spaced, generally parallel relation to each other.

Each of the interposer segments 230a, 230b, 230c of the interposer 230 comprises an interposer body 232 having a top surface 234, a bottom surface 236, an opposed pair of longitudinal side surfaces 237, and an opposed pair of lateral side surfaces. Disposed on the top surface 234 of the interposer body 232 of each of the first, second and third segments 230a, 230b, 230c is a plurality of top pads 238. Similarly, disposed on the bottom surface 236 of each of the first, second and third segments 230a, 230b, 230c is a plurality of bottom pads 240. The top and bottom pads 238, 240 disposed on the interposer body 232 of each of the first, second and third segments 230a, 230b, 230c are segregated into multiple pairs, with the top pad 238 of each pair being disposed in spaced, substantial vertical alignment with the bottom pad 240 of the same pair. The top and bottom pads 238, 240 of each pair within each of the first and second segments 230a, 230b are electrically connected to each other by one or more conductive vias 242 which extend through the interposer body 232 substantially perpendicularly between the top and bottom pads 238, 240 of the corresponding pair. The top and bottom pads 238, 240 of each pair are preferably identically configured to each other, and fabricated from a suitable conductive material, as is the conductive via(s) 242 extending therebetween. Those of ordinary skill in the art will recognize that the top and bottom pads 238, 240 of each pair need not necessarily be in exact vertical alignment, and that some degree of juxtaposition therebetween is contemplated to fall within the scope of the present invention.

In the semiconductor package 200, each bottom pad 240 in each of the first, second and third segments 230a, 230b, 230c is electrically connected to a respective one of the top contacts 218 of a corresponding set thereof by a solder ball 244. However, those of ordinary skill in the art will recognize that solder paste, conductive adhesive, or other suitable materials may be employed as an alternative to the use of the solder balls 244. As seen in FIG. 3, such attachment is preferably facilitated such that one of the longitudinal side surfaces 237 of each of the first and second segments 230a, 230b extends in generally co-planar relation to a respective one of the sides or peripheral edge segments defined by the bottom substrate 212. Formed on each of the bottom contacts 220 of the bottom substrate 212 is a solder bump or solder ball 246.

The semiconductor package 200 of the third embodiment further comprises a laminate top substrate 248 which is mechanically and electrically connected to the interposer 230 in a manner which will be described in more detail below. The top substrate 248 also has a generally quadrangular configuration defining four (4) peripheral edge segments. In addition, the top substrate 248 defines a generally planar top surface 250 and an opposed, generally planar bottom surface 252. Disposed on the top surface 250 of the top substrate 248 is a plurality of top contacts 254 of the top substrate 248. Additionally, formed on the bottom surface 252 of the top substrate 248 is a plurality of bottom contacts 256 thereof. In the top substrate 248, some of the bottom contacts 256 are segregated into three sets, with the bottom contacts 256 of two of these three sets extending along and in spaced relation to a respective one of an opposed pair of the peripheral edge segments defined by the top substrate 248. The bottom contacts 256 of the third set extend between and in generally parallel relation to the bottom contacts 256 of the other two sets thereof. Though not shown, the top and bottom contacts 254, 256 are electrically connected to each other by conductive vias which extend through the top substrate 248. Those of ordinary skill in the art will recognize that each top contact 254 may be electrically connected to one or more bottom contacts 256 in any pattern or arrangement through the use of such conductive vias. The top and bottom contacts 254, 256 are also each preferably identically configured to each other, and fabricated from a suitable conductive material, as is any conductive via extending there between.

Attached to the bottom surface 252 of the top substrate 248 is at least one, and preferably multiple electronic components 224. Such electronic component(s) 224 may comprise semiconductor dies, passive devices or the like provided in any combination. The attachment of one or more of the electronic components 224 to the bottom surface 252 of the top substrate 248 may be facilitated by an adhesive layer. In the semiconductor package 200, the pads or terminals of the electronic components 224 are electrically connected to certain ones of the bottom contacts 256 through the use of a flip-chip connection. Though not shown in FIG. 3, it is contemplated that the electronic components 224 may be electrically connected to such bottom contacts 256 through the use of conductive wires as an alternative to the use of a flip-chip connection.

In the semiconductor package 200, each top pad 238 of each of the first, second and third segments 230a, 230b, 230c of the interposer 230 is electrically connected to a respective one of the bottom contacts 256 of a corresponding set thereof by a solder ball 258. However, those of ordinary skill in the art will recognize that solder paste, conductive adhesive, or other suitable materials may be employed as an alternative to the use of the solder balls 258. As is also seen in FIG. 3, such attachment is preferably facilitated such that one of the longitudinal side surfaces 237 of each of the first and second segments 230a, 230b extends in generally co-planar relation to a respective one of the sides or peripheral edge segments defined by the top substrate 248. Thus, in addition to extending in generally co-planar relation to respective longitudinal side surfaces 237 of the first and second segments 230a, 230b, the peripheral edge segments defined by the top substrate 248 also extend in generally co-planar relation to respective ones of the peripheral edge segments defined by the bottom substrate 212. When the top substrate 248 is electrically and mechanically connected to the interposer 230 in the above-described manner, the electronic components 222, 224 as well as the conductive wires 228 are effectively positioned between the bottom and top substrates 212, 248, and more particularly the top surface 214 of the bottom substrate 212 and the bottom surface 252 of the top substrate 248. Further, the third segment 230c of the interposer 230 creates an effective barrier between the electronic component 222 and one of the electronic components 224, the advantages of which will be discussed in more detail below.

In the semiconductor package 200, the electronic components 222, 224, wires 228, portions of the first and second segments 230a, 230b of the interposer 230, and the entirety of the third segment 230c of the interposer 230 are encapsulated or covered by an encapsulant material which is injected between the bottom and top substrates 212, 248. Such encapsulant material, upon hardening, forms a package body 260 of the semiconductor package 200. Also fully covered by the package body 260 are the solder balls 244, 258 used to effectuate the electrical connection between the first, second and third segments 230a, 230b, 230c of the interposer 230 and the bottom and top substrates 212, 248. The fully formed package body 260 directly contacts the top surface 214 of the bottom substrate 212 as well as the bottom surface 252 of the top substrate 248, and extends to a substantially flush relationship to the peripheral edge segments thereof. In addition, the package body 260 defines multiple side surfaces 262, and is formed such that one of the longitudinal side surfaces 237 of the interposer body 232 of each of the first and second segments 230a, 230b is exposed in and substantially flush with a respective one of such side surfaces 262. Further, though not shown, it is contemplated that each of the lateral side surfaces of the interposer body 232 of each of the first, second and third segments 230a, 230b, 230c will be exposed in and substantially flush with a respective one of the side surfaces 262. The orientation of the third segment 230c of the interposer 230 n the semiconductor package 200 allows one or more of the electronic components 222, 224 to be "compartmentalized" for purposes of shielding the same from the remaining electronic component(s) 222, 224.

As indicated above, in the semiconductor package 200, three sets of the top contacts 218 are provided on the bottom substrate 212, with the top contacts 218 of two of these sets extending along respective ones of an opposed pair of side surfaces 262 defined by the package body 260. Similarly, three sets of the bottom contacts 256 are provided on the top substrate 248, with the bottom contacts 256 of two of these sets extending along respective ones of an opposed pair of side surfaces 262 defined by the package body 260. However, it is contemplated that the top contacts 218 and bottom contacts 256 (other than those to which the third segment 230c and electronic components 124 are connected) may each be segregated into greater or fewer than two sets, and may be arranged so as to extend along one or more of the side surfaces 262 defined by the package body 260 in any combination. As will be recognized, if such top contacts 218 and bottom contacts 256 are each arranged as a single set extending along only a single, common side surface 262 of the package body 260, such semiconductor package may include an interposer 230 having the third segment 230c and only one of the above-described first and second segments 230a, 230b. Alternatively, if multiple sets of such top contacts 218 and bottom contacts 256 are provided so as to extend along respective ones of each of the side surfaces 262 of the package body 260, the interposer 230 may be formed to have a continuous ring-like or frame-like configuration, with the third segment 230c bisecting such frame. The top contacts 254 of the top substrate 248 provide top side routing also known as a "lands-over-top" feature in the completed semiconductor package 200.

Referring now to FIGS. 4A-4D, there is depicted an exemplary sequence of steps which may be used to facilitate the simultaneous fabrication of multiple semiconductor packages 100 constructed in accordance with the second embodiment of the present invention. As seen in FIG. 4A, in the initial step of the fabrication process, a plurality of the top substrates 148 are provided, with the electronic component(s) 124 being electrically connected to certain ones of the bottom contacts 156 of each of the top substrates 148 in the same manner described above in relation to the semiconductor package 100 shown in FIG. 2. As is further shown in FIG. 4A, for each top substrate 148, solder balls 158 are formed on those bottom contacts 156 which are arranged as the two sets extending along respective ones of an opposed pair of the peripheral edge segments defined by such top substrate 148.

In the next step of the fabrication process, a bottom substrate strip 312 is provided, such bottom substrate strip 312 including multiple bottom substrates 112 which are integrally connected to each other. In this respect, disposed on the top surface of the bottom substrate strip 312 is a plurality of the top contacts 118 which are oriented such that each of the bottom substrates 112 included in the bottom substrate strip 312 is provided with an assortment of the top contacts 118 arranged in the same pattern described above in relation to the bottom substrate 112 of the semiconductor package 100 shown in FIG. 2. As shown in FIG. 4B, electrically connected to the top contacts 118 of the bottom substrate strip 312 is an interposer strip 330 which comprises a plurality of interposers 130 integrally connected to each other. The interposer strip 330 is oriented relative to the bottom substrate strip 312 such that each of the interposers 130 within the interposer strip 330 is aligned with and electrically connected to the top contacts 118 of a corresponding one of the bottom substrates 112 in the bottom substrate strip 312 in the same manner described above in relation to the electrical connection of the interposer 130 to the bottom substrate 112 in the semiconductor package 100 shown in FIG. 2. The electrical connection of the interposer strip 330 to the top contacts 118 of the bottom substrate strip 312 is preferably accomplished by initially forming solder balls 144 upon respective ones of the top contacts 118, and completing a reflow process subsequent to the abutment of the bottom pads 140 of each of the interposers 130 within the interposer strip 330 against respective ones of the solder balls 144.

As further shown in FIG. 4B, in addition to the interposer strip 330 being electrically connected to the bottom substrate strip 312 in the aforementioned manner, one or more electronic components 122 is/are attached to a prescribed location of the top surface of the bottom substrate strip 312. The electronic component(s) 122 is/are electrically connected to certain ones of the top contacts 118 of a corresponding one of the bottom substrates 112 within the bottom substrate strip 312 in the same manner described above in relation to the electrical connection of the electronic component 122 to certain ones of the top contacts 118 of the bottom substrate 112 in the semiconductor package 100 shown in FIG. 2. Additionally, the electronic component(s) 122 is/are oriented in respective voids or openings 331 of the interposer strip 330, each such opening 331 extending between the first and second segments 130a, 130b of a respective one of the interposers 130 within the interposer strip 330.

In the next step of the fabrication process shown in FIG. 4C, each of the top substrates 148 shown in FIG. 4A is mated and electrically connected to a respective one of the interposers 130 within the interposer strip 330. The mounting and electrical connection of each top substrate 148 to a respective interposer 130 is accomplished in the same manner described above in relation to the electrical connection of the top substrate 148 to the interposer 130 in the semiconductor package 100 shown in FIG. 2. In this regard, each of the solder balls 158 formed on respective ones of the bottom contacts 156 on each of the top substrates 148 is brought into direct contact with a respective one of the top pads 138 included in each of the interposers 130 of the interposer strip 330. Thereafter, a reflow process is completed as effectively electrically connects each of the top substrates 148 to a corresponding one of the interposers 130 within the interposer strip 330.

Subsequent to the mounting and electrical connection of each of the top substrates 148 to respective ones of the interposers 130 within the interposer strip 330, a suitable encapsulant material or mold compound is injected between the top surface of the bottom substrate strip 312 and the bottom surface 152 of each of the top substrates 148 mounted and electrically connected to the interposer strip 330. Thus, the encapsulant material effectively fills each of the openings 331 defined by the interposer strip 330. As shown in FIG. 4D, upon the hardening of the encapsulant material, a singulation process is completed to effectively separate the bottom substrate strip 312 into the individual bottom substrates 112, and to further separate the interposer strip 330 into the individual interposers 130. As further shown in FIG. 4D, the singulation process is also completed such that portions of the bottom substrate strip 312 and hardened encapsulant material are removed as needed to cause one of the longitudinal side surfaces 137 of each of the first and second interposer segments 130a, 130b of each interposer 130 to extend in substantially flush relation to a respective side surface 162 of the package body 160 in each resultant semiconductor package 100, and as also described above in relation to the semiconductor package shown in FIG. 2. It is contemplated that the singulation process described above will completed through sawing, though alternative singulation methods may also be employed without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
a bottom substrate including a plurality of contacts disposed thereon;
at least one electronic component attached to the bottom substrate and electrically connected to at least one the contacts thereof;
an interposer electrically connected to at least some of the contacts of the bottom substrate;
a top substrate including a plurality of contacts disposed thereon, at least some of the contacts of the top substrate being electrically connected to the interposer; and
a package body defining a peripheral side surface, the package body at least partially encapsulating the top and bottom substrates, the interposer and the electronic component such that at least portions of the bottom substrate and the top substrate are not covered by the package body, and at least a portion of the interposer is exposed in the side surface of the package body.

2. The semiconductor package of claim 1 wherein a plurality of electronic components are attached to the bottom substrate in a stacked arrangement, each of the electronic components being electrically connected to at least one of the contacts of the bottom substrate and encapsulated by the package body.

3. The semiconductor package of claim 1 wherein the interposer comprises:
   an interposer body;
   a plurality of pads disposed on the interposer body, at least some of the pads being electrically connected to respective ones of at least some of the contacts of the top substrate, and at least some of the pads being electrically connected to respective ones of at least some of the contacts of the bottom substrate; and
   a plurality of conductive vias extending through the interposer body and electrically connecting corresponding pairs of the pads to each other.

4. The semiconductor package of claim 3 wherein the interposer body further defines at least one side surface segment which is exposed in the side surface of the package body.

5. The semiconductor package of claim 3 wherein at least some of the pads are electrically connected to respective ones of the contacts of the bottom substrate by solder balls which are covered by the package body, and at least some of the pads are electrically connected to respective ones of the contacts of the top substrate by solder balls which are covered by the package body.

6. The semiconductor package of claim 1 further comprising at least one electronic component attached to the top substrate and electrically connected to at least some of the contacts of the top substrate, each of the electronic components of the semiconductor package being covered by the package body.

7. The semiconductor package of claim 1 wherein:
   the bottom and top substrates each have a generally quadrangular configuration defining multiple peripheral edge segments;
   the contacts of the bottom substrate are segregated into at least two sets which extend along respective ones of at least two of the peripheral edge segments of the bottom substrate;
   the contacts of the top substrate are segregated into at least two sets which extend along respective ones of at least two of the peripheral edge segments of the top substrate; and
   the interposer comprises separate first and second segments which are electrically connected to respective ones of the sets of the contacts of the bottom substrate and the contacts of the top substrate.

8. The semiconductor package of claim 7 wherein the first and second segments of the interposer each comprise:
   an interposer body;
   a plurality of pads disposed on the interposer body, at least some of the pads being electrically connected to respective ones of at least some of the contacts of the top substrate, and at least some of the pads being electrically connected to respective ones of at least some of the contacts of the bottom substrate; and
   a plurality of conductive vias extending through the interposer body and electrically connecting corresponding pairs of the pads to each other.

9. The semiconductor package of claim 1 wherein the electronic component comprises at least one semiconductor die which is electrically connected to at least some of the contacts of the bottom substrate by conductive wires which are covered by the package body.

10. The semiconductor package of claim 1 wherein at least some of the contacts of the bottom substrate include a solder bump formed thereon.

11. A semiconductor package comprising:
   a bottom substrate including a plurality of contacts disposed thereon;
   a top substrate including a plurality of contacts disposed thereon;
   at least one electronic component attached to the bottom substrate and electrically connected to at least some the contacts of the bottom substrate;
   a means for electrically connecting at least some of the contacts of the bottom substrate to at least some of the contacts of the top substrate; and
   a package body defining a peripheral side surface, the package body at least partially encapsulating the top and bottom substrates, the electrical connection means and the electronic component such that at least portions of the bottom substrate and the top substrate are not covered by the package body, and at least a portion of the electrical connection means is exposed in the side surface of the package body.

12. The semiconductor package of claim 11 wherein at least one electronic component is attached to the top substrate and electrically connected to at least some of the contacts of the top substrate, each of the electronic components of the semiconductor package being encapsulated by the package body.

13. The semiconductor package of claim 11 wherein the electrical connection means comprises an interposer having:
   an interposer body;
   a plurality of pads disposed on the interposer body, at least some of the pads being electrically connected to respective ones of at least some of the contacts of the top substrate, and at least some of the pads being electrically connected to respective ones of at least some of the contacts of the bottom substrate; and
   a plurality of conductive vias extending through the interposer body and electrically connecting corresponding pairs of the pads to each other.

14. The semiconductor package of claim 13 wherein the interposer body further defines at least one side surface segment which is exposed in the side surface of the package body.

15. The semiconductor package of claim 13 wherein at least some of the pads are electrically connected to respective ones of the contacts of the bottom substrate by solder balls which are covered by the package body, and at least some of the pads are electrically connected to respective ones of the contacts of the top substrate by solder balls which are covered by the package body.

16. The semiconductor package of claim 13 wherein:
   the bottom and top substrates each have a generally quadrangular configuration defining multiple peripheral edge segments;
   the contacts of the bottom substrate are segregated into at least two sets which extend along respective ones of at least two of the peripheral edge segments of the bottom substrate;
   the contacts of the top substrate are segregated into at least two sets which extend along respective ones of at least two of the peripheral edge segments of the top substrate; and
   the interposer comprises separate first and second segments which are electrically connected to respective ones of the sets of the contacts of the bottom substrate and the contacts of the top substrate.

17. The semiconductor package of claim 16 wherein the first and second segments of the interposer each comprise:
an interposer body;
a plurality of pads disposed on the interposer body, at least some of the pads being electrically connected to respective ones of at least some of the contacts of the top substrate, and at least some of the pads being electrically connected to respective ones of at least some of the contacts of the bottom substrate; and
a plurality of conductive vias extending through the interposer body and electrically connecting corresponding pairs of the pads to each other.

18. The semiconductor package of claim 13 wherein:
the bottom and top substrates each have a generally quadrangular configuration defining multiple peripheral edge segments;
the contacts of the bottom substrate are segregated into at least three sets, with two of the sets extending along respective ones of at least two of the peripheral edge segments of the bottom substrate and one of the sets extending between the two remaining sets;
the contacts of the top substrate are segregated into at least three sets, with two of the sets extending along respective ones of at least two of the peripheral edge segments of the top substrate and one of the sets extending between the two remaining sets; and
the interposer comprises separate first, second and third segments which are electrically connected to respective ones of the sets of the contacts of the bottom substrate and the contacts of the top substrate, the third segment of the interposer effectively separating at least two of the electronic components from each other.

19. The semiconductor package of claim 18 wherein the first, second and third segments of the interposer each comprise:
an interposer body;
a plurality of pads disposed on the interposer body, at least some of the pads being electrically connected to respective ones of at least some of the contacts of the top substrate, and at least some of the pads being electrically connected to respective ones of at least some of the contacts of the bottom substrate; and
a plurality of conductive vias extending through the interposer body and electrically connecting corresponding pairs of the pads to each other.

20. The semiconductor package of claim 11 further comprising a plurality of electronic components attached to the top substrate and electrically connected to at least some the contacts of the top substrate, at least two of the electronic components attached to the top substrate being separated from each other by the electrical connection means.

* * * * *